United States Patent
Keil et al.

(10) Patent No.: US 8,426,025 B2
(45) Date of Patent: Apr. 23, 2013

(54) PROCESS AND METHOD FOR MODIFYING POLYMER FILM SURFACE INTERACTION

(75) Inventors: Matthias Keil, Malmö (SE); Jakob Nilsson, Lund (SE); Johan Ring, Malmö (SE); Babak Heidari, Furulund (SE)

(73) Assignee: Obducat AB, Malmo (SE)

( * ) Notice: Subject to any disclaimer, the term of this patent is extended or adjusted under 35 U.S.C. 154(b) by 306 days.

(21) Appl. No.: 12/635,296

(22) Filed: Dec. 10, 2009

(65) Prior Publication Data

US 2010/0155988 A1 Jun. 24, 2010

Related U.S. Application Data

(60) Provisional application No. 61/139,023, filed on Dec. 19, 2008.

(30) Foreign Application Priority Data

Dec. 19, 2008 (EP) .................................... 08172338

(51) Int. Cl.
*B32B 27/08* (2006.01)

(52) U.S. Cl.
USPC .......................... 428/411.1; 264/496; 428/421

(58) Field of Classification Search .................. 264/496; 425/383, 404; 428/411.1, 421
See application file for complete search history.

(56) References Cited

U.S. PATENT DOCUMENTS

| | | | |
|---|---|---|---|
| 2,305,433 A | 12/1942 | Kyle | |
| 2,883,372 A | 4/1959 | Gelu | |
| 4,211,617 A | 7/1980 | Hunyar | |
| 5,334,424 A | 8/1994 | Tsutomu et al. | |
| 5,459,213 A | 10/1995 | Kelsey | |
| 5,772,905 A | 6/1998 | Chou | |
| 6,334,960 B1 | 1/2002 | Wilson et al. | |
| 6,705,853 B1 | 3/2004 | Nehring | |
| 6,939,664 B2 | 9/2005 | Huang et al. | |
| 6,953,332 B1 | 10/2005 | Kurk et al. | |
| 7,204,686 B2 | 4/2007 | Chung et al. | |

(Continued)

FOREIGN PATENT DOCUMENTS

DE 37 14011 A1 2/1988
EP 0 405 843 A2 1/1991

(Continued)

OTHER PUBLICATIONS

Cho et al., "UV initiated free radical and cationic photopolymerizations of acrylate/epoxide and acrylate/vinyl ether hybrid systems with and without photosensitizer", Journal of Applied Polymer Science vol. 93, 1473-1483, 2004.*

(Continued)

*Primary Examiner* — Galen Hauth
(74) *Attorney, Agent, or Firm* — Renner, Otto, Boisselle & Sklar, LLP

(57) ABSTRACT

The invention provides a modification of a polymer film surface interaction properties. In this process a polymer carrier object is covered by a chemical composition, comprising photo-polymerizable compounds, photo-initiators or catalysts with the ability to initiate polymerization and semi-fluorinated molecules. The so-produced polymer mold contains semi-fluorinated moieties, which are predominantly located on the surface and on the surface near region of the patterned surface. The polymer mold is suitable as a template with modified properties in a nano-imprint lithography process.

7 Claims, 3 Drawing Sheets

U.S. PATENT DOCUMENTS

Figure 1A:
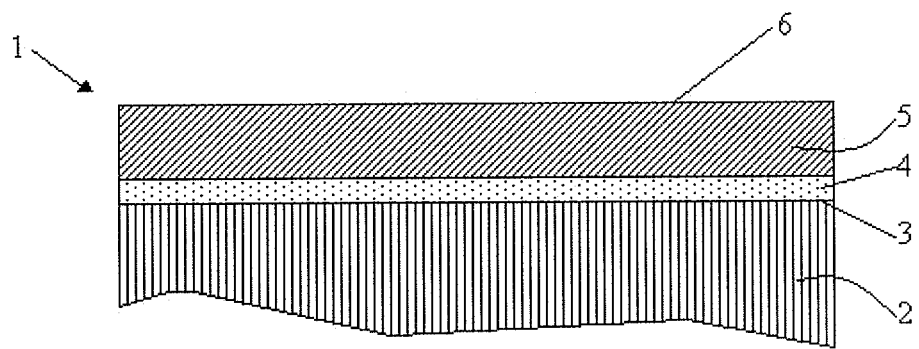

| | | | |
|---|---|---|---|
| 2001/0031802 A1 | 10/2001 | Murschall et al. | |
| 2002/0089088 A1 | 7/2002 | Ils et al. | |
| 2002/0092962 A1 | 7/2002 | Domeier et al. | |
| 2002/0160215 A1 | 10/2002 | Peiffer et al. | |
| 2003/0071016 A1 | 4/2003 | Shih et al. | |
| 2003/0159608 A1 | 8/2003 | Heidari | |
| 2003/0211297 A1 | 11/2003 | Rossing et al. | |
| 2003/0230817 A1 | 12/2003 | Crook | |
| 2004/0032063 A1 | 2/2004 | Walther | |
| 2004/0110856 A1 | 6/2004 | Young et al. | |
| 2004/0137734 A1 | 7/2004 | Chou et al. | |
| 2004/0170771 A1 | 9/2004 | Bailey et al. | |
| 2004/0183236 A1 | 9/2004 | Ogino et al. | |
| 2004/0219803 A1 | 11/2004 | Staecker et al. | |
| 2005/0082700 A1 | 4/2005 | Deeman et al. | |
| 2005/0084804 A1 | 4/2005 | Truskett et al. | |
| 2005/0146083 A1 | 7/2005 | Olsson | |
| 2005/0167047 A1 | 8/2005 | Huff et al. | |
| 2005/0191419 A1 | 9/2005 | Helt | |
| 2005/0208779 A1 | 9/2005 | Klauk et al. | |
| 2006/0110914 A1 | 5/2006 | Gehoski et al. | |
| 2007/0102844 A1 | 5/2007 | Simon et al. | |
| 2007/0272825 A1 | 11/2007 | Xu et al. | |
| 2007/0282466 A1 | 12/2007 | Spindler et al. | |
| 2008/0000373 A1* | 1/2008 | Petrucci-Samija et al. | 101/401.1 |

FOREIGN PATENT DOCUMENTS

| | | | |
|---|---|---|---|
| EP | 0 813 255 A1 | 12/1997 | |
| EP | 1 127 912 A1 | 8/2001 | |
| EP | 1 132 418 A1 | 9/2001 | |
| EP | 1 160 775 A2 | 12/2001 | |
| EP | 1 465 175 A1 | 10/2004 | |
| EP | 1 533 657 A1 | 5/2005 | |
| GB | 559072 | 2/1944 | |
| GB | 637105 | 5/1950 | |
| JP | 10-330577 | 12/1998 | |
| JP | 2002-086463 | 3/2002 | |
| JP | 2003272250 | 9/2003 | |
| JP | 2008-515059 | 5/2008 | |
| WO | 97/06468 | 2/1997 | |
| WO | 01/42858 A1 | 6/2001 | |
| WO | 01/70489 | 9/2001 | |
| WO | 02/09894 | 2/2002 | |
| WO | 03/031096 | 4/2003 | |
| WO | 03/072625 | 9/2003 | |
| WO | 2004/021083 | 3/2004 | |
| WO | 2004/089546 | 10/2004 | |
| WO | 2005/045524 | 5/2005 | |
| WO | 2005/054948 | 6/2005 | |
| WO | WO 2005101466 A2 * | 10/2005 | |
| WO | 2005/109095 | 11/2005 | |
| WO | 2005/119360 | 12/2005 | |
| WO | 2006/131153 | 12/2006 | |

OTHER PUBLICATIONS

Copending U.S. Appl. No. 11/450,377, filed Jun. 12, 2006 (specification and claims being provided herewith).

Copending U.S. Appl. No. 11/268,574, filed Nov. 8, 2005 (specification and claims being provided herewith).

Copending U.S. Appl. No. 11/305,157, filed Dec. 19, 2005 (specification and claims being provided herewith).

J.Y. Shin et al., Chemical Structure and Physical Properties of Cyclic Olefin Copolymers, IUPAC Technical Report, Pure Appl. Chem., vol. 77, No. 5, pp. 801-814, 2005, DOI: 10.1351/pad200577050801.

T. Nielsen et al., "Nanoimprint lithography in the cyclic olefin copolymer, Topas®, a highly ultraviolet-transparent and chemically resistant thermoplast", Journal of Vacuum Science & Technology B: Microelectronics Processing and Phenomena, American Vacuum Society, new York, NY, US, vol. 22., No. 4. (Jul. 2004), pp. 1770-1775.

T. Nielsen et al., "Nanoimprint lithography in the cyclic olefin copolymer, Topas®, a highly UV-transparent and chemically resistant thermoplast", Journal of Vacuum Science & Technology, vol. 22., No. 4., Jul. 2004.

Choi et al., Fluorinated Organic-Inorganic Hybrid Mold as a New Stamp for Nanoimprint and Soft Lithography, American Chemical Society, vol. 21, No. 21, 2005, pp. 9390-9392.

Barbero et al., High Resolution Nanoimprinting with a Robust and Reusable Polymer Mold, Advanced Functional Materials, vol. 17, No. 14, 2007, pp. 2419-2425.

European Search Report dated Apr. 15, 2009 for corresponding European Patent Application No. 08172338.9.

European Search Report dated Sep. 1, 2009 for European Patent Application No. 08172342.1 corresponding to copending U.S. Appl. No. 12/635,329.

Vabrik el al.; "A Study of Epoxy Resin—Acrylated Polyurethane Semi-Interpenetrating Polymer Networks", Journal of Applied Polymer Science, vol. 68, 1998, pp. 111-119.

Decker, "UV-radiation curing chemistry", Pigment & Resin Technology, vol. 30, No. 5, 2001, pp. 278-286.

Decker et al.; "Photoinitiated Polymerization of Vinyl Ether and Acrylate Monomer Mixtures", J.M.S.—Pure Appl. Chem., vol. A34(4), 1997, pp. 605-625.

* cited by examiner

PROCESS AND METHOD FOR MODIFYING POLYMER FILM SURFACE INTERACTION

This application claims priority under 35 USC §119 (e) to U.S. Provisional Application No. 61/139,023 filed Dec. 19, 2008, and under 35 USC §119 (a) to European Application No. 08172338.9 filed on Dec. 19, 2008, the entire disclosures of which are incorporated herein by reference.

TECHNICAL FIELD OF INVENTION

The present invention relates to Nano-Imprinting in general and especially to the polymer mold with anti-sticking or anti-adhesion properties.

BACKGROUND OF THE INVENTION

One of the most powerful techniques for reproducing nanostructures—i.e. structures in the order of 100 nm or smaller—is nanoimprint lithography (NIL). In nanoimprint lithography an inverted copy of the surface pattern of a template—often called a stamp—is transferred into an object, comprising a substrate and, applied thereto, a film of a moldable layer often called resist, e.g. a polymer material. After heating the object to a temperature above the glass transition temperature of the polymer film, the stamp is pressed towards the film, cooled and released from the stamp—often called demolding—to give a polymer film with the desired pattern. This process is defined as a "thermal imprint process". Alternatively, a photoresist material, i.e. a resin composition, which cures upon exposure to photon radiation, covers the substrate. This so-called "Photon-imprint process" requires that either the substrate or the stamp is transparent. In a process subsequent to the imprint, the object—comprising the substrate and the patterned polymer film—can be post-processed, e.g. by etching of the substrate within the imprinted regions to transfer the pattern to a target surface of the substrate.

A method for transferring a pattern from a template to an object in an imprint process has been suggested, which involves a two-step process, which is described in JPA no. 2008-515059, U.S. patent application Ser. No. 11/450,377, U.S. patent application Ser. No. 11/268,574 and U.S. patent application Ser. No. 11/305,157.

The template or master used in an imprint process is generally a high cost product, and wear or damages to the template should therefore be minimized. The template may be made of any material, but is often made of Si, Ni, Ti, other metals, or quartz, optionally provided with an anti-stick layer. On the other hand, the object to be imprinted is often made of a relatively hard material, such as glass, quartz, a metal, a metal-oxide, silicon, or another semiconductor material, sometimes coated with different layers comprising metal, alloys, organic or carbonaceous materials. On their surfaces a comparatively soft moldable imprint layer is exposed. The imprinting of the object is a crucial moment, where parallel arrangement is important, and a very small residual layer of the moldable layer, often in the order of less than 10 nm, under the imprinted protruding structures is desired. Any non-parallel arrangement or excessive pressure may therefore cause damage to the template. By the suggested two-step imprint method, the template will only be used against a polymer material, which is softer than the template material, thereby minimizing the risk of damage.

If the template and the substrate are not made of the same material, which they generally are not, they will typically have different thermal expansion coefficients. This means that during heating and cooling of the template and the substrate, the extent of expansion and contraction will be different. Even though the dimensional change is small, it may be devastating in an imprint process, since the features of the pattern to be transferred are in the order of micrometers or even nanometers. The result may therefore be reduced replication fidelity.

One of the most crucial properties in the photon-based 2-step imprint process is the anti-sticking or anti-adhesion properties between both interfaces of 1) the original template and the IPS resist and 2) the cured and patterned IPS resist and the substrate resist.

SUMMARY OF THE INVENTION

A method for transferring a pattern from a template to an object in an imprint process has been suggested, which involves a photon-based two-step process. In the first step, a template having a structured surface is contacted with a polymer material to produce a flexible polymer replica having an inverse structured surface pattern of the template surface, herein referred to as an intermediate polymer stamp (IPS). In the second step, the IPS replica is used as a template in order to produce a second replica. It is coated with a moldable surface to give a replica displaying a pattern identical with the original template.

The IPS is produced when a polymer carrier object coated with photo-polymerizable compounds, is pressed towards a template, deformed and cured with the 2STU, e.g., STU process. After demolding, the patterned IPS will be applied as a new template to replicate its pattern in a photon based imprint process. Among the most crucial properties 2-step imprint process are the anti-sticking or anti-adhesion properties of both the interfaces of the original template and the IPS resist as well as the cured and patterned IPS resist and the substrate resist.

It is an object of the invention to provide a material that comprising photo-reactive compounds with one or several types of chemical functionalities e.g. acrylates, epoxides or vinyl ethers. Additionally, the material comprises photo-initiators or catalysts and semi-fluorinated molecules. When contacting this material with a surface of a template, exhibiting low surface energy, the semi-fluorinated molecules will diffuse to the surface near region of that surface of the chemical composition facing the template surface. The material is coated on a polymer carrier object and used in an improved imprint process, having high replication fidelity, and which is easy and suitable to employ industrially.

BRIEF DESCRIPTION OF THE TABLES AND FIGURES

Table 1:
  Table 1 displays results from contact angles measurements for water, 1,5-pentanediol, diiodomethane and ethylene glycol provided on different surfaces.
Table 2:
  Table 2 displays surface energies, together with their dispersion and polar contributions calculated from the contact angle results of table 1 applying the model of Owens, Wendt, Rabel and Kaelble. Additionally, the table contains the calculated work of adhesions and interface energies for different interfaces, calculated from the assorted surface energies contributions displayed in table 2 with the help of equations 2 and 4.
  FIG. 1 illustrates
  a) the different layers covering the polymer carrier object, and
  b) the different layers covering the substrate.

Figure 2:
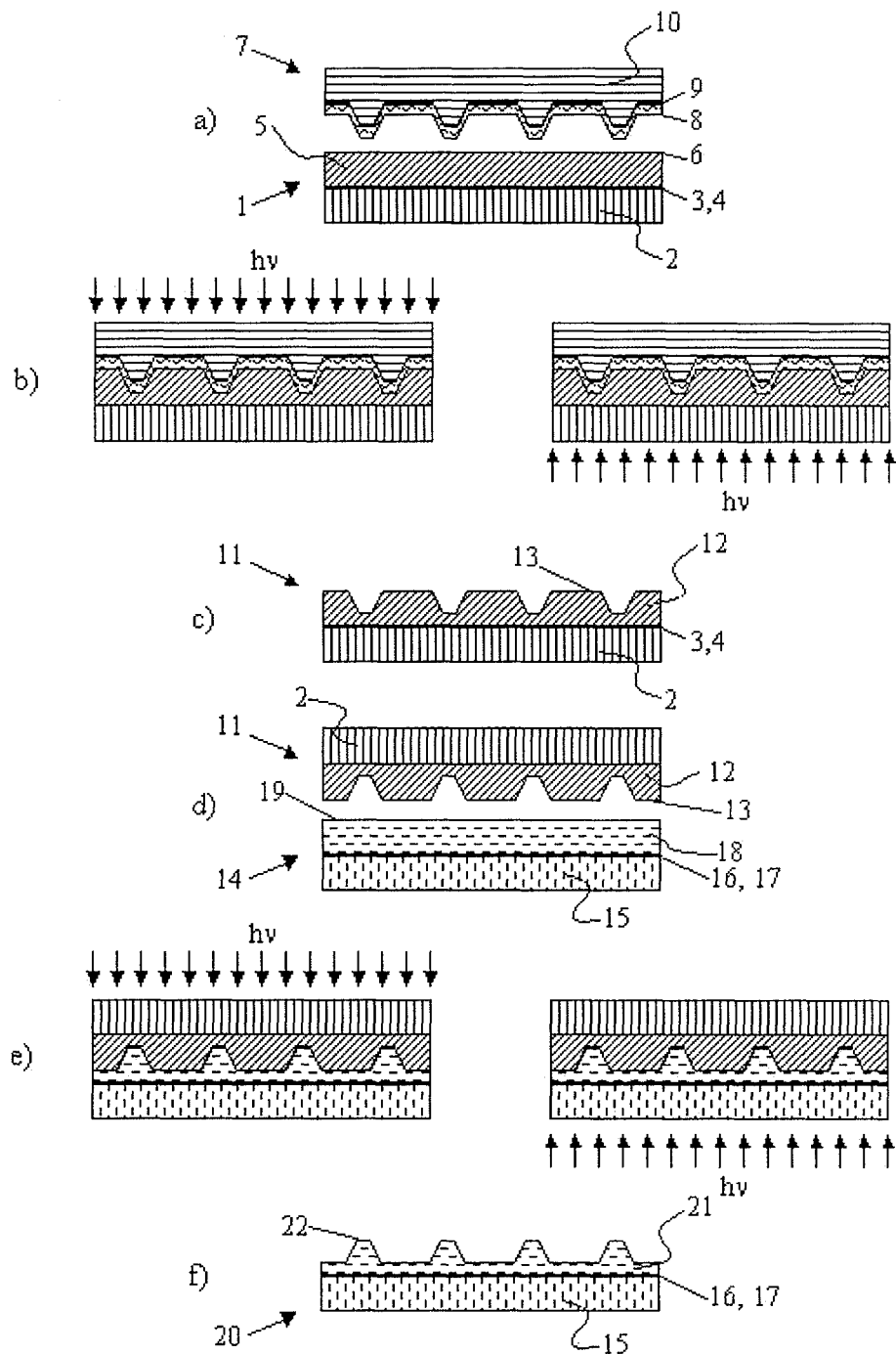

FIG. 2 schematically shows the 2-step imprint process.

Figure 3:
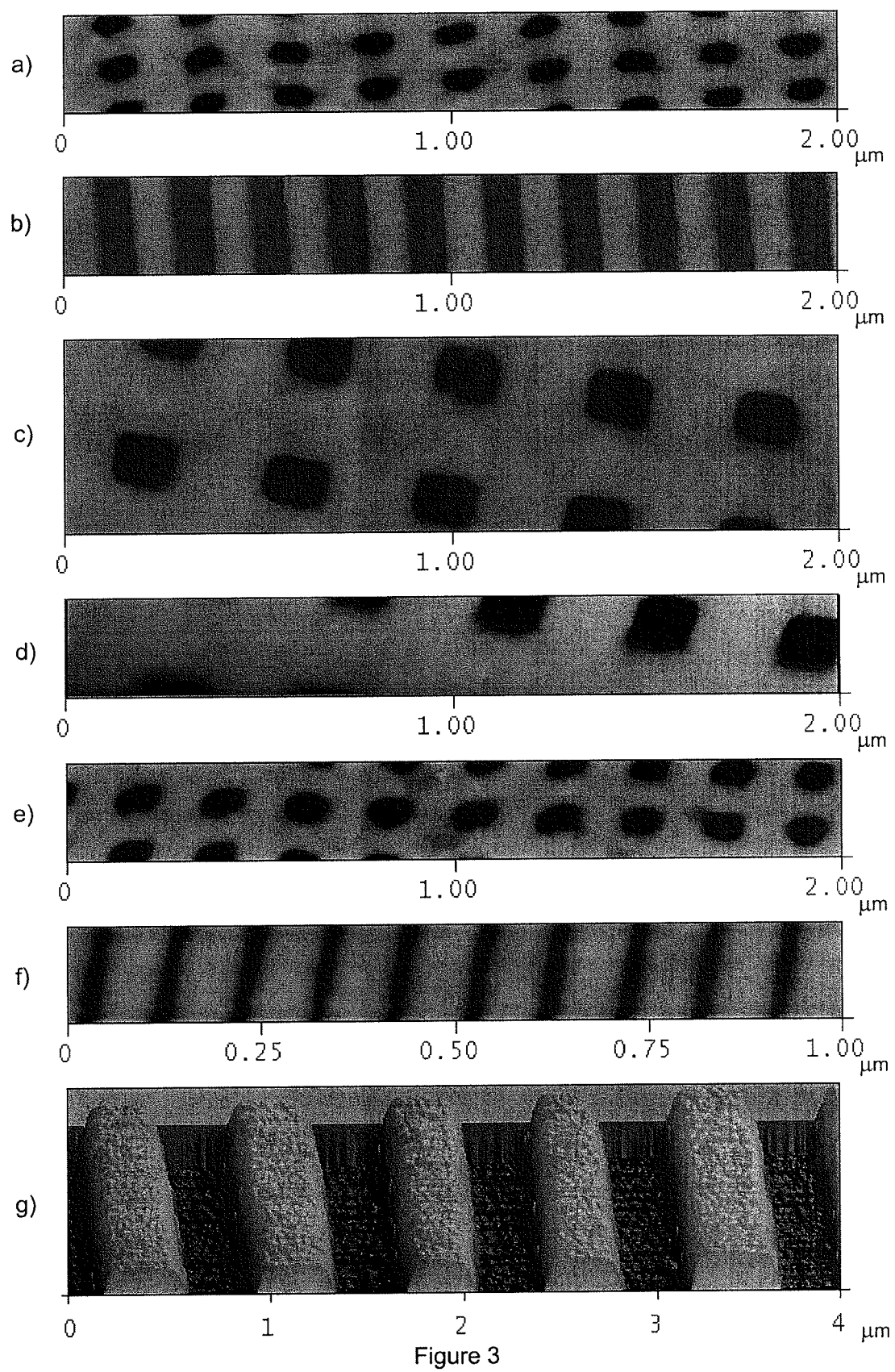

FIG. 3 displays AFM images of the substrate resist surfaces after performed imprints applying the 2-step imprint process. The different IPS and substrate resist formulations are provided by this invention. Stamps with various pattern sizes and the different IPS and substrate resist formulations have been applied.

DETAILED DESCRIPTION OF THE EMBODIMENTS OF THE INVENTION

The original stamp or template is usually equipped with an anti-sticking layer (i.e. a self assembling monolayer film) in order to decrease its surface energy, which is described in Japanese patent no. 3892460 in 2006 and U.S. patent application Ser. No. 11/597,570. High contact angles are usually observed for various liquids commonly employed in contact angle measurements, as illustrated in table 1. Especially for water the observed contact angles are higher than 100°, due to the high hydrophobicity of the anti-sticking treated surfaces.
Anti-Adhesion Properties of the IPS Comprising a Fluoro-Surfactant-Containing Resist Composition:

Semi-fluorinated molecules or fluoro-surfactants have the characteristic of lowering the surface energy of a liquid phase efficiently even at low concentrations. Thus, the introduction of fluoro-surfactants into a composition comprising photo-reactive compounds can lower the surface energy by forming a concentrated fluorocarbon layer at the surface of the liquid. A phase segregation occurs into a fluoro-surfactants-rich and a fluoro-surfactants-poor phase which can thermodynamically be described by Gibbs adsorption equation $$\Gamma = -\frac{C}{RT}\left(\frac{d\gamma}{dC}\right)_T \quad [1]$$

with $\Gamma$ the surface (interface) excess concentration, c the molecular concentration of the fluoro-surfactant, $\gamma$ the surface (interface) energy and R/T the molecular gas constant/temperature (see e.g. [Hiemenz, Rajagopalan]). If fluoro-surfactants are introduced into a composition comprising photo-reactive compounds, $d\gamma/dC$ will become negative and therefore $\Gamma$ positive. This leads to an enrichment of the fluoro-surfactants at the surface (interface) in order to decrease the surface (interface) energy.

Regarding the 2-step imprint process, in the first step the stamp equipped with an anti-sticking layer will be pressed against a non-cured resist composition comprising fluoro-surfactants. The non-cured resist can be regarded as a liquid with high viscosity. The resist is deposited onto a polymer carrier object.

Herein, the term "polymer carrier object" refers to a flexible, ductile, and transparent polymer specimen, comprising a thermoplast or a thermosetting polymer material. Typical materials are polycarbonate, polymethyl methacrylate (PMMA), polyethylene terephthalate (PET), and polyethylene naphthalate (PEN). Preferably, the polymer carrier object is homogenously made of one or more of these materials, but in an alternative embodiment the material may comprise other compounds as well. The polymer carrier object might be a thin polymer film fabricated in an extrusion process (typical thickness 50-200 micrometer) [Osswald] or a disk, fabricated with the help of an injection molding process (typical thickness 300 micrometer up to 1 millimeter).

The low surface energy of the anti-sticking treated stamp (<20 mJ/m²—see table 2) leads to an enrichment of the fluoro-surfactants at the resist/stamp interface in order to minimize its interface energy (see Equation 1). The occurred phase segregation will affect the work of adhesion at the resist/stamp interface, defined as:

$$W_A = \gamma_{stamp} + \gamma_{resist} - \gamma_{stamp,resist} \quad [2]$$

The work of adhesion can be regarded as the required work necessary to remove a liquid (e.g. resist) from a solid surface (e.g. stamp) (see e.g. [Adamson, Gast]). Usually, the work of adhesion $W_A$ of an interface (Eq. 2) comprising a stamp equipped with an anti-sticking layer and a resin composition comprising fluoro-surfactants is lower than that comprising an anti-sticking treated stamp and a resist without fluoro-surfactants, because in the first case both the stamp and the non-cured resist exhibit low surface energies, $\gamma_{stamp}$ and $\gamma_{resist}$, and $W_A$ will be low even if the interface energy $\gamma_{stamp, resist}$ is very small. On the other hand the fluoro-surfactant containing resist will obtain a more pronounced wettability with the stamp (i.e. smaller contact angles will be observed)—compared to the non-fluorine-containing species because the fluoro-surfactants are reducing the surface energy of the resist—and additionally also the interface energy of the stamp resist interface—acting as a wetting agent. The better wetting leads to a more pronounced and faster penetration of the pattern of the stamp under the assumption that the viscosity of resist remains almost unchanged by the introduction of low concentrations of the fluoro-surfactants. This behavior can be expressed by the following relation:

$$z(t) = \left(\frac{r\gamma_{resist}\cos\theta_\infty}{2\eta}\left[t - \frac{a}{c} + \frac{ae^{-ct}}{c}\right]\right)^{1/2} \quad [3]$$

where z(t) is the vertical penetration distance of the resist into a pattern comprising cylindrical pores with a diameter r at a time t. The liquid has the viscosity $\eta$ and the surface energy $\gamma_{resist}$, $\theta_\infty$ is the contact angle after infinite times and a and c adjustable parameters (see e.g. [Pocius]). Equation is valid if no external pressure will be applied.

Thus the introduction of fluoro-surfactants has three advantages; first the increased pattern penetration enables both the reduction of the applied pressure between the stamp and the IPS in the imprint process, second is the decrease of the process time and third, the reduced surface energy that improves the wettability and—after curing—adhesion with impurity particles, resulting in a better cleaning effect of the stamp.

Table 1 shows typical contact angles with water, 1,5-pentanedial, diiodomethane and ethylene glycol. Water contact angles higher than 100° could be observed for the different formulations after curing. Additionally, when the surface energy is divided into polar forces and dispersion forces, according to the model of Owens and Wendt, the surface energy $\gamma$ of the IPS is strongly dominated by the dispersion contribution $\gamma^d$ whereas the polar contribution $\gamma^p$ is very low due to the non-polarity of the fluoro-surfactants.

Table 2 presents some parameters which are important for the characterization of different surfaces or interfaces of the stamp/IPS, e.g. $\gamma$, $\gamma^d$, $\gamma^p$, $W_A$, $\gamma_{1,2}$. The different parameters have been calculated from contact angles measurements (table 1). As expected, the interfaces are characterized by low work of adhesions, $W_A$, of approx. 30 mJ/m² and low interface energies, $\gamma_{1,2}$ of almost 0 mJ/m² up to below 1 mJ/m². A low work of adhesion is very adventurous when a joint should exhibit low adhesion strength so that demolding can be performed easily. Low interface energies are found when the two surfaces establishing an interface are chemically very similar e.g. in their polarity. For example a joint consisting of two completely similar materials exhibits an interface energy of 0 mJ/m².

Application of an IPS Comprising a Fluoro-Surfactant-Containing Resist Composition as a Mold for Nano-Imprint Lithography:

The large interfacial energies will occur if the applied materials located at the interface of a joint are unlike, e.g. one exhibits high polarity and one is almost non-polar. In the model of Owens and Wendt the work of adhesion can be expressed as:

$$W_A = 2(\gamma_1^d \gamma_2^d)^{1/2} + 2(\gamma_1^p \gamma_2^p)^{1/2} \quad [4]$$

whereas $\gamma_i^d$ and $\gamma_i^p$ are the dispersion and polar contributions of the cured IPS resist (assigned as 1) and of the non-cured substrate resist (assigned as 2)—see [Pocius]. Taking into account the low surface energy of the cured IPS resist—which is dominated by its dispersion contribution—the materials suitable to be applied for the substrate resist can be selected in a way to reduce $W_A$ in equation [4].

On the other hand a higher polar contribution $\gamma_2^p$ will not increase $W_A$ drastically, because of the low value of $\gamma_1^p$. However, a more polar substrate resist will downgrade the wetting properties. Wettability is a crucial property of adhesion. A non-cured resist that is composed of polar ingredients exhibits a high surface energy and therefore a high work of cohesion ($W_c = 2\gamma_{liquid}$). This high work of cohesion leads to reduced wetting behavior of the liquid with an IPS surface exhibiting low surface energy. According Equation [3] penetration with the nano-structured IPS surface is downgraded and—even more important—the diffusion into small sub-10 nm-sized pores or cavities located on the IPS surface is reduced.

After curing of the substrate resist the work of adhesion $W_A$ of equations [2] and [4] has to be modified in a way to achieve the work, which is required to break an interfacial bond between two solid materials $W_B$:

$$W_B = f(W_A)\zeta \quad [5]$$

Here, $f(W_A)$ is a function of $W_A$ and $\zeta$ is defined as a function describing the dissipation of mechanical energy into the materials. If the two materials are completely brittle, they do not demonstrate mechanical deformation upon demolding; then $W_B = W_A = \gamma_1 + \gamma_2 - \gamma_{1,2}$. This work can be considered to be the minimum of practical adhesion that one can obtain in an interfacial bond. The different parameters, depicting the solid/solid interfaces are also illustrated in table 2. Compared to the Ni stamp/IPS resist interfaces the IPS resist/substrate resist interfaces are characterized by slightly higher values of $W_A$ (approx. 40-54 mJ/m²) and also by higher values of $\gamma_{1,2}$ (approx. 2-4 mJ/m²). The higher values of $\gamma_{1,2}$ can be interpreted that the two surfaces establishing the IPS resist/substrate resist interfaces are chemically less "similar" than the two surfaces establishing the Ni stamp/IPS resist interfaces. The pronounced mechanical interlocking (leading to plastic deformation upon demolding) can increase the quantities of $W_A$ from values typically below 60 mJ/m² to $W_B$ of several J/m². Here, 4 will increase and even when $W_A$ is small, $W_B$ will be quite large.

Another crucial parameter is diffusion between the non-cured substrate resists and the cured IPS resist if the cured resist is soluble in the components of the non-cured one. For pronounced anti-adhesion properties the cured resist should be insoluble in the non-cured resist. At least, electrostatic interactions between the IPS and the substrate resist could be minimized when the two surfaces do not exhibit opposite electronegativity characters, which would reduce $\gamma_p$ of Equation [4] concerning the acid-base model of Fowkes [Pocius].

Chemistry of IPS Resist and Substrate Resist Formulations:

Formulations containing mixtures of different mono- or multi-functionalized monomers and/or oligomers, which after curing exhibits high degrees of cross-linking and low solubility, are applied as imprint materials. The acrylate based resists are characterized by high reactivity and polymerize rapidly in the presence of photogenerated free radicals and in the absence of oxygen at ambient temperature. The acrylate-based resists are for many reasons attractive material, but generally suffer from drawbacks such as high oxygen sensitivity and large shrinkage upon polymerization. Cationic induced polymerization of epoxides and vinyl ethers is comparatively slow, but offers several advantages such as good mechanical properties of the resist, low shrinkage, and an oxygen insensitive process. The present innovation describes how material properties from different polymers may be combined by blending proper ratios of interpenetrating polymer networks (IPNs) forming a hybrid polymer system comprising for example both acrylates and epoxides [Vabrik et al]. The synthesis of IPNs is achieved by photoinitiated polymerization of monomers, which polymerize through different mechanisms, typically photoinitiated free radial mechanism and photoinitiated cationic mechanism.

The developed IPS resist may be either a pure acrylate-based resist or a hybrid resist comprising both: acrylates and epoxides, or acrylates and vinyl ethers. Acrylate comprising hybrid resists are generally characterized by a fast curing of the acrylate monomers leading to a close to full conversion of the acrylates and lower conversions of the epoxides/vinyl ether. The high conversion of the acrylates circumvents polymerization of the remaining acrylates present close to the surface of the IPS resist and an acrylate-based substrate resist, which facilitates efficient demolding.

Proper selection of both the photoinitiators and radiation wavelengths enables a sequential build-up of a hybrid IPNs [Decker], [Decker, Decker]. This refinement of the hybrid polymerization allows the synthesis of a highly cross-linked acrylate network, prior to the initiation of the epoxy network synthesis. This is achieved by exposing the non-cured IPS formulation to filtered radiation (wavelength>350 nm), absorbed solely by the free radical photoinitiator e.g. 2,4,6-trimethylbenzoylphenylphosphinate, but not by the cationic photoinitiator. In the second step the sample is exposed to unfiltered PHOTON BASED radiation, which is absorbed by the cationic photoinitiator e.g. triarylsulfonium hexafluorophosphate, thus initiating polymerization of the epoxy monomers within the existing acrylate polymer network forming the IPNs. The sequential polymerization is here presented as a promising technique for the improvement of material properties such as reduced polymer shrinkage, due to the low shrinkage of the epoxides, and higher imprint fidelity etc.

The anti-sticking treatment of the IPS resist results in a low surface energy, necessary for enhanced release properties between in particular the IPS resist and the substrate resist. A low IPS surface energy leads to a low work of adhesion $W_A$ and—if the substrate resist is selected carefully—a high interfacial energy $\gamma_{1,2}$. One class of molecules that have showed strong potential as efficient fluoro-surfactants, with the ability to diffuse to the surface of the mold resist forming an anti-sticking layer, are perfluoropolyether (PFPE) based derivatives end terminated with one or several chemical functionalities, such as (meth)acrylates. For example, the PFPE backbone has been linked to the (meth)acrylates via linear or branched aliphatic urethane block copolymers chain and is manufactured, which has the following structure:

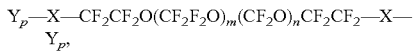

where X is an aliphatic urethane building block, Y is a (meth) acrylate and p equals one or two. The molecular weight of the PFPE part of the co-polymer is 1500-2000 g/mol and the ratio m/n is 1.5 to 2.5.

Substrate Resist

The substrate resist may be a purely acrylate based resist, or a hybrid resist, with material properties combined from the two types of polymers, comprising acrylates and vinyl ethers, or acrylates and epoxides.

IPS resist composition 1

Composition 1 (referred to as "IPS50") is a purely acrylate-based IPS formulation containing approximately 0.25% by weight of the fluoro-surfactant Y—X—$CF_2CF_2O(CF_2F_2O)_m$ $(CF_2O)_nCF_2CF_2$—X—Y, where X is a short linear urethane block copolymers chain and Y is a methacrylate group.

IPS Resist Composition 2

Composition 2 (referred to as "IPS70/95") is an acrylate/epoxide-hybrid IPS formulation containing approximately 1% by weight of a fluoro-surfactant with the structure:

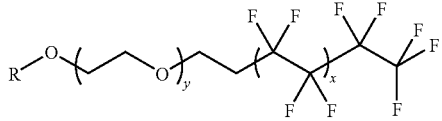

where R is a chemical functionality with the ability to bind covalently to the IPS material upon curing, e.g. acrylate, x is an integer in a range of 0 to 7, inclusive; and y is an integer in a range of 0 to 15, inclusive.

IPS Resist Composition 3

Composition 3 (referred to as "IPS105") is an acrylate/epoxide-hybrid IPS formulation containing approximately 1% by weight of the fluoro-surfactant $Y_2$—X—$CF_2CF_2O$ $(CF_2F_2O)_m(CF_2O)_nCF_2CF_2$—X—$Y_2$, where X is a long branched urethane block copolymers chain and Y is an acrylate group.

IPS Resist Composition 4

Composition 4 (referred to as "IPS110") is an acrylate/epoxide-hybrid IPS formulation containing approximately 0.8% by weight of the fluoro-surfactant $Y_2$—X—$CF_2CF_2O$ $(CF_2F_2O)_m(CF_2O)_nCF_2CF_2$—X—$Y_2$, where X is a long branched urethane block copolymers chain and Y is an acrylate group, and 0.6% by weight of a fluoro-surfactant with the structure specified in IPS composition 2.

IPS Resist Composition 5

Composition 5 (referred to as "IPS102") is a purely acrylate-based IPS formulation containing approximately 1% by weight of the fluoro-surfactant $Y_2$—X—$CF_2CF_2O(CF_2F_2$ $O)_m(CF_2O)_nCF_2CF_2$—X—$Y_2$, where X is a long branched urethane block copolymers chain and Y is an acrylate group.

Substrate Resist Composition 1

Substrate resist 1 (referred to as "SR20/47") is a purely acrylate-based substrate resist formulation without functionalized siloxanes.

Substrate Resist Compositions 2

Substrate resist 2 compositions (referred to as "SR02") are a purely acrylate-based substrate resists formulations containing functionalized siloxanes.

Substrate Resist Compositions 3

Substrate resist 3 compositions (referred to as "SR35") are a purely acrylate-based substrate resists formulations without functionalized siloxanes.

Figure 1B:
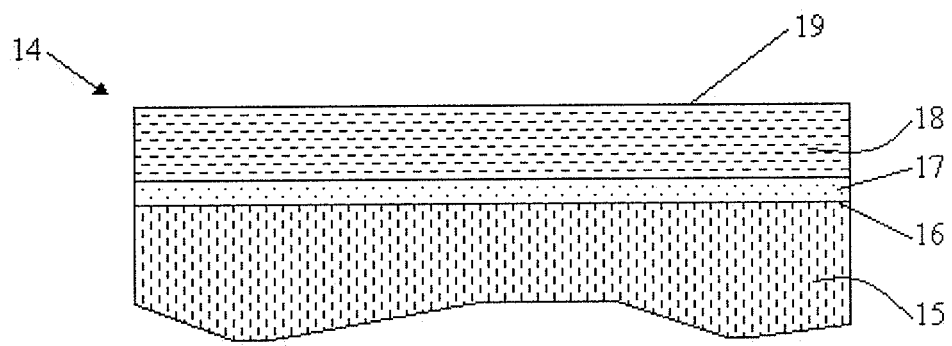

Description of the Process:

The two material assemblies 1 and 14 as displayed in FIGS. 1a and 1b, respectively, can be regarded as the essential prerequisite to succeed the two-step process illustrated in FIG. 2. Here, the first step is illustrated in FIGS. 2a-2c and the second step in FIGS. 2d-2f. In FIG. 2a the stamp or template 10, composed of e.g. silicon, quartz, nickel or other metal such as aluminum or titanium, an alloy or even a polymer material has a patterned surface 9, comprising ribs, grooves, protrusions or recesses, having heights and widths in the order of micrometers or nanometers. The template surface 9 is equipped with an anti-adhesion layer 8. The template 10 is placed with the surface of the anti-adhesion layer 8 in a way facing and contacting a surface 6 of the specimen 1. After placing, a pressure between 1-40 bars is applied on the backsides of either the template 10 or the polymer carrier object 2 in order to press the template 10 and the specimen 1 together. The resist 5 will fill the cavities of the template surface 9, equipped with an anti-sticking layer 8. Additionally, the fluoro-surfactants will predominately settle at the surface 6—now facing the template anti-sticking layer 8—or within the surface-near region of the resist 5 in order to minimize the interface energy of the interface between the template anti-sticking layer 8 and the resist surface 6.

The sandwich arrangement—consisting of a template 10 equipped with an anti-sticking layer 8, a polymer carrier object 2, and photo-polymerizable resist 5 and maybe an adhesion promoter 4—is irradiated with ultraviolet light either through the backside of the template 10 or through the polymer carrier object 2 as displayed in FIG. 2b). In the first case the template has to be transparent, whereas in the second case the polymer carrier object has to fulfill this requirement.

A photon radiation cures the resist and creates a solidified, low-surface-energy replica, having a pattern that is inversed to that of the original template. Once the photo curing is completed, the template 10 is separated or demolded from the flexible polymer replica 11 leaving a relief image on the surface 13 of the solidified photopolymer film 12, coated on the polymer carrier object 2 as displayed in FIG. 2c.

After demolding neither plastic deformations of patterns of the surface 13 can be observed nor resist rip-off,—e.g. residuals of the cured resist 12 or the non-cured resist 5 that has been ruptured from the polymer carrier object 2 upon the performed imprint will cover the surface of the template 10. This is due to pronounced anti-sticking or anti-adhesion properties of the interface between the resist surface 13 and the template anti-sticking film 8 due to a well-defined material composition of the applied materials and their surfaces as described in the chapters "Anti-Adhesion Properties of the IPS comprising a fluoro-surfactant-containing resist composition". The flexible polymer replica 11 herein is referred to as an intermediate polymer stamp (IPS).

In the second step of the two-step process the IPS 11 is used to transfer the pattern of its surface 13 to a target substrate as illustrated in FIGS. 2d)-2f). Here, the surface 13 of the flexible polymer stamp 11 will be placed in contact with a surface 19 of an object 14 comprising a substrate 15 having a surface 16 covered by a thin moldable surface layer 18 of a non-cured photo curable resist. A thin organic layer 17 acting as an adhesion promoter might be placed in-between the substrate surface 16 and the resist 18.

As illustrated in FIG. 2e with the help of an applied pressure lying between 1 to 40 bars the IPS 11 and object 14 will be forced together and after applied exposure of the photo-curable resist 18 to radiation, the resist will be cured. After release an inversion of the pattern located on the surface 13 of the IPS 11 has been formed in the surface 22 of the layer 21, as shown in FIG. 2f. Usually, the IPS 11 has to be transparent to the applied radiation or shows minor absorbance in order to transmit a sufficient amount of radiation necessary for curing the resist 18 upon exposure to radiation.

EXAMPLES

Several IPS and substrate resist formulations has been evaluated which fulfill the requirement of this invention to provide materials for an improved imprint process, having high replication fidelity, and which is easy and suitable to employ industrially. The different formulations could easily be applied within the 2-step process—schematically described in FIG. 2—without any further anti-sticking treatment of the IPS (surface 13 in FIG. 2c or 2d), and thus avoids the need of an external process, as for example a plasma treatment, and/or a coating of an additional thin film.

Five Selected examples of Ni stamps or templates having patterns as small as sub 100 nm range they were covered by a thin anti-sticking film—as described in Japanese patent no. 3892460 in 2006 subsequent to their applications within the different contact angle experiments and imprint tests described hereunder:

Table 1 displays results for water, 1,5-pentanediol, diiodomethane and ethylene glycol applied to different surfaces. The contact angle measurements have been carried out with a Tracker contact-angle measurement instrument from Teclis. The investigated surfaces can be divided into three different categories:

1) Row 1 and row 2 display data for the original Ni template or stamp (surface 8 of FIG. 2a). Due to the anti-sticking treatment of the Ni templates the hydrophobic surfaces are characterized by high contact angles observed for water (107.6° and 106.3°, respectively).

2) Row 3 to row 7 display contact angles of the different IPS resists containing semi-fluorinated molecules acting as fluoro-surfactants (surface 6 of FIGS. 1a and 2a). The investigated IPS resist solutions are IPS102, IPS105, IPS110, IPS50 and IPS70/95 and the different formulations have been prepared by spin-coating onto silicon wafers, pretreated with adhesion promoters, such as methacrylate silanes. The resulting film thicknesses were measured to be 600-1200 nm. After curing the fluoro-surfactants are cross-linked which generates a fluorinated surface, with pronounced hydrophobicity.

Row 8 to row 10 display data for the substrate resist (surface 19 of FIGS. 1b and 2d). The investigated substrate resist solutions are SR35, SR02, and SR20/47, and the different formulations have been prepared by spin-coating onto silicon wafers, pretreated with adhesion promoters, such as methacrylate silanes. The resulting film thicknesses are approximately 70 nm for SR02; and 600 nm for SR35 and SR20/47. The contact angles observed for the surfaces of the cured non-fluorinated substrate resists (rows 8-10) are significantly lower than those observed for the surfaces of the fluorinated IPS resists (rows 3-7).

With the help of the contact angles displayed in Table 1 the surface energies, together with their dispersion and polar contributions have been calculated utilizing the model of Owens, Wendt, Rabel and Kaelble. The different values are displayed in table 2 columns 2 and 4. Additionally, the calculated work of adhesions and interface energies for different interfaces, calculated from the assorted surface energies contributions with the help of equations 2 and 4, are displayed in table 2, column 5. The calculated parameters should represent the following interfaces, divided in five groups:

Group 1:

Group 1 displays parameters characterizing the surfaces of the original Ni template, several cured-IPS resist compositions, and their interfaces (surfaces 8 of FIG. 2a and the surfaces 6 of FIGS. 1a and 2a after curing). The patterned Ni stamp surface is characterized by low surface energy dominated by the dispersion contribution $\gamma^d$.

Groups 2-5:

The parameters displayed in groups 2 to 5 stand for the interfaces of several IPS resist compositions and several substrate resist compositions. Each group represents the interfaces of one IPS resist to one or two substrate resists. The values represents the surfaces and interfaces between the surface 13 of FIGS. 2c and 2d and the surface 19 of FIGS. 1b and 2d after curing. The calculated surface energies of the substrate resists are significantly larger than those of the surfactant containing IPS resists.

Example 1

A 1.5 μm thick film of the IPS resists IPS70/95 was spin-coated onto a polycarbonate film having a thickness of 125 μm. A 2-step imprint process was carried out according to FIG. 2. The anti-sticking treated Ni stamp 1 was pressed against the polymer film for 60 sec with a pressure of 30 bars, the resist was cured with photon radiation for 90 sec as illustrated in FIG. 2b. During the exposure time the applied pressure was kept at 30 bars. Afterwards, the Ni stamp was separated from the cured IPS. The IPS comprising a polycarbonate film equipped with a completely cured IPS resist was applied in the second imprint process (FIG. 2d). A SR02 substrate resist was spin-coated to a thickness of 50 nm onto a silicon wafer, pretreated with an acrylate silane employed as an adhesion promoter for improved adhesion. The second imprint was performed as described above with a photon radiation time of 30 sec (FIG. 2e). After demolding, the cured substrate resist was examined by AFM. FIG. 3a displays an image of the substrate resist surface (surface 22 in FIG. 2f) with dimensions of the applied Ni stamp pattern given in the caption of FIG. 3a.

Example 2

An imprint with Ni Stamp 2 was performed according to the description of Example 1 using a 1 μm thick SR20/47 film as substrate resist in the second imprint step and—in the second imprint step—with a photon radiation time of 60 sec.

FIG. 3b displays an image of the substrate resist surface with dimensions of the applied Ni stamp pattern given in the caption of FIG. 3b.

Example 3

An imprint with Ni Stamp 3 was performed according to the description of Example 1. However, the applied substrate resist (SR02) was 70 nm thick. FIG. 3c displays an image of the substrate resist surface with dimensions of the applied Ni stamp pattern given in the caption of FIG. 3c.

Example 4

An imprint with Ni Stamp 3 was performed according to the description of Example 3 using a 1 μm thick IPS110 film as an IPS resist in the first imprint step. FIG. 3d displays an image of the substrate resist surface with dimensions of the applied Ni stamp pattern given in the caption of FIG. 3d.

Example 5

An imprint with Ni Stamp 1 was performed according to the description of Example 1 using a 1.5 μm thick IPS105 film as an IPS resist in the first imprint step. FIG. 3e displays an image of the substrate resist surface with dimensions of the applied Ni stamp pattern given in the caption of FIG. 3e.

Example 6

An imprint with Ni Stamp 4 exhibiting a smaller structure sizes, was performed according to the description of Example 5. FIG. 3f displays an image of the substrate resist surface with dimensions of the applied Ni stamp pattern given in the caption of FIG. 3f.

Example 7

An imprint with Ni Stamp 5, exhibiting a larger pattern, was performed according to the description of Example 1 using a 1.5 μm thick IPS50 film as IPS in the first imprint step and a 1 μm thick SR20/47 film as substrate resist in the second imprint step and an with a photon radiation time of 60 sec in both imprint steps. FIG. 3g displays an image of the substrate resist surface with dimensions of the applied Ni stamp pattern given in the caption of FIG. 3g.

TABLE 1

| | | water [°] | 1,5-pentane diol [°] | Diiodo-methane [°] | Ethylene Glycol [°] |
|---|---|---|---|---|---|
| 1 | Ni stamp patterned | 107.6 | 87.5 | 92.5 | — |
| 2 | Ni stamp non-patterned | 106.3 | 81.4 | 87.7 | — |
| 3 | IPS102 | 104.2 | 86.1 | 79.0 | — |
| 4 | IPS105 | 105.1 | 86.5 | 86.2 | — |
| 5 | IPS110 | 105.4 | 83.5 | 89.7 | — |
| 6 | IPS50 | 100.7 | — | 78.8 | 88.1 |
| 7 | IPS70/95 | 100.2 | — | — | — |
| 8 | SR35 | 82.0 | 67.4 | 72.1 | — |
| 9 | SR02 | 85.3 | 57.0 | 57.6 | — |
| 10 | SR20/47 | 79.1 | 54.3 | 47.1 | — |

TABLE 2

| | Column 1: Template | Column 2: Surface energy of the template | | | Column 3: Replica | Column 4: Surface energy of the replica | | | Column 5: Interface parameters | |
|---|---|---|---|---|---|---|---|---|---|---|
| Group | | $\gamma$ [mJ/m$^2$] | $\gamma^d$ [mJ/m$^2$] | $\gamma^p$ [mJ/m$^2$] | | $\gamma$ [mJ/m$^2$] | $\gamma^d$ [mJ/m$^2$] | $\gamma^p$ [mJ/m$^2$] | $W_A$ [mJ/m$^2$] | $\gamma_{1,2}$ [mJ/m$^2$] |
| Group 1 | Ni stamp patterned | 13.14 | 11.37 | 1.77 | IPS102 | 19.18 | 18.03 | 1.15 | 31.50 | 0.83 |
| | | | | | IPS105 | 16.09 | 14.44 | 1.65 | 29.04 | 0.19 |
| | | | | | IPS110 | 14.77 | 12.82 | 1.95 | 27.86 | 0.05 |
| Group 2 | IPS102 | 19.18 | 18.03 | 1.15 | SR35 | 29.30 | 21.69 | 7.61 | 45.47 | 3.01 |
| | | | | | SR02 | 33.69 | 29.95 | 3.74 | 50.63 | 2.25 |
| Group 3 | IPS105 | 16.09 | 14.44 | 1.65 | SR35 | 29.30 | 21.69 | 7.61 | 42.48 | 2.91 |
| | | | | | SR02 | 33.69 | 29.95 | 3.74 | 46.56 | 3.22 |
| Group 4 | IPS110 | 14.77 | 12.82 | 1.95 | SR35 | 29.30 | 21.69 | 7.61 | 41.10 | 3.01 |
| | | | | | SR02 | 33.69 | 29.95 | 3.74 | 44.95 | 3.87 |
| Group 5 | IPS15 | 20.15 | 18.13 | 2.02 | SR20/47 | 36.25 | 31.64 | 4.61 | 54.00 | 2.40 |

REFERENCES

[Hiemenz, Rajagopalan] P. C. Hiemenz and R. Rajagopalan, "*Principles of Colloid and Surface Chemistry*", Marcel Dekker, Inc., New York, Third Edition, 1997.

[Adamson, Gast] A. W. Adamson and A. P. Gast "*Physical Chemistry of Surfaces*", John Wiley & Sons, Inc., New York, Sixth Edition, 1997.

[Pocius] A. V. Pocius "*Adhesion and Adhesive Technology*"; Hanser Publishers, Munich, Second Edition, 2002.

[Osswald] T. Osswald, J. P. Hernandez-Ortiz, "*Polymer Processing—Modelling and Simulation*" Hanser Publishers, Munich 2006.

[Vabrik el al] R. Vabrik, I. Czajlik, G. Tury, I. Rusznak, A. Me, A. Vig, "*A study of epoxy resin-acrylated polyurethane semi-interpenetrating polymer networks*", Journal of applied polymer science, Vol 68, 1998, pp 111-119.

[Decker] C. Decker, "*PHOTON BASED-radiation curing chemistry*", Pigment & Resin Technology, Vol 30(5), 2001, pp 278-286.

[Decker, Decker] C. Decker, D. Decker, "*Photoinitiated polymerization of vinyl ether and acrylate monomer mixtures*"; J.M.S.—Pure Appl. Chem., Vol A34(4), 1997, pp 605-625.

The invention claimed is:

1. A polymer mold precursor made in an intermediate imprint stamp process using a patterned template, wherein the polymer mold precursor comprises:
   a polymer carrier object; and
   a curable polymeric film covering the polymer carrier object and having a patterned surface opposite the polymeric carrier object, the curable polymeric film comprising photo-polymerizable monomers and/or oligomers, photo-initiators, with the ability to initiate polymerization, and semi-fluorinated molecules, which are soluble in said photo-polymerizable monomers and/or oligomers and are completely or partly terminated by chemical functionalities with the ability to bind covalently to said photo-polymerizable monomers and/or oligomers, and wherein the semi-fluorinated molecules are predominantly located on the patterned surface of the curable polymeric film.

2. The polymer mold of claim 1, wherein said semi-fluorinated molecules will diffuse within the curable polymeric film to the surface region near the patterned surface of the curable polymeric film.

3. The polymer mold of claim 1, wherein said semi-fluorinated molecules are PFPE co-polymers with the structure $Y_p\text{-}X\text{-}CF_2CF_2O(CF_2F_2O)_m(CF_2O)_nCF_2CF_2\text{-}X\text{-}Y_p$, where X is an aliphatic urethane block, Y is an acrylate or a methacrylate, m and n are integers, and p equals 2-3, with a molecular weight of the PFPE part of the co-polymer of 800-2000 g/mol.

4. The polymer mold of claim 1, wherein said curable polymeric film contains polymerizable mono- or multifunctional acrylate-based monomers and at least one free radical photoinitiator.

5. The polymer mold of claim 1, wherein said curable polymeric film is a hybrid comprising polymerizable mono- or multifunctional acrylate monomers, polymerizable mono- or multifunctional epoxides, at least one free radical photoinitiator and at least one cationic photoinitiator.

6. The polymer mold of claim 1, wherein said curable polymeric film is a hybrid comprising polymerizable mono- or multifunctional acrylate monomers, polymerizable mono- or multifunctional vinyl ethers, at least one free radical photoinitiator and at least one cationic photoinitiator.

7. The polymer mold of claim 3, wherein said X in the chemical formula is an aliphatic urethane block and the cured polymeric film is a hybrid comprising interpenetrating networks.

* * * * *